US008188546B2

(12) United States Patent
Anderson et al.

(10) Patent No.: US 8,188,546 B2
(45) Date of Patent: May 29, 2012

(54) MULTI-GATE NON-PLANAR FIELD EFFECT TRANSISTOR STRUCTURE AND METHOD OF FORMING THE STRUCTURE USING A DOPANT IMPLANT PROCESS TO TUNE DEVICE DRIVE CURRENT

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 221 days.

(21) Appl. No.: 12/542,747

(22) Filed: Aug. 18, 2009

(65) Prior Publication Data

US 2011/0042748 A1    Feb. 24, 2011

(51) Int. Cl.
*H01L 29/66* (2006.01)
(52) U.S. Cl. .......... 257/365; 257/E29.264; 257/E21.421
(58) Field of Classification Search .................. 257/270, 257/300, 330, 365, 401
See application file for complete search history.

(56) References Cited

U.S. PATENT DOCUMENTS

| | | | |
|---|---|---|---|
| 6,876,042 B1 | 4/2005 | Yu et al. | |
| 6,909,147 B2 | 6/2005 | Aller et al. | |
| 6,992,354 B2 | 1/2006 | Nowak et al. | |
| 7,224,029 B2 | 5/2007 | Anderson et al. | |
| 7,259,425 B2 | 8/2007 | An et al. | |
| 7,323,389 B2 | 1/2008 | Goktepeli et al. | |
| 7,416,925 B2 | 8/2008 | Lin et al. | |
| 2004/0256683 A1* | 12/2004 | Lee et al. ...................... 257/412 |
| 2007/0090026 A1 | 4/2007 | Han et al. | |
| 2008/0121948 A1 | 5/2008 | Kim et al. | |
| 2009/0251946 A1* | 10/2009 | Juengling ..................... 365/149 |

OTHER PUBLICATIONS

Breed et al., "Dual Gate (finFET) and Tri-Gate MOSFETs: Simulation and Design", Semiconductor Device Research Symposium, 2003, pp. 150-151, Dec. 2003.
Kim et al., "Bulk Inversion in FinFETs and Implied Insights on Effective Gate Width", IEEE Transactions on Electron Devices, vol. 52, No. 9, Sep. 2005, pp. 1993-1997.
Collaert et al., "Integration Challenges for Multi-Gate Devices", IEEE International Conference on Integrated Circuit and Technology, 2005, pp. 187-194.

(Continued)

*Primary Examiner* — N Drew Richards
*Assistant Examiner* — Mamadou Diallo
(74) *Attorney, Agent, or Firm* — Gibb I.P. Law Firm, LLC; Richard M. Kotulak, Esq.

(57) ABSTRACT

Disclosed are embodiments of a semiconductor structure that includes one or more multi-gate field effect transistors (MUGFETs), each MUGFET having one or more semiconductor fins. In the embodiments, a dopant implant region is incorporated into the upper portion of the channel region of a semiconductor fin in order to selectively modify (i.e., decrease or increase) the threshold voltage within that upper portion relative to the threshold voltage in the lower portion and, thereby to selectively modify (i.e., decrease or increase) device drive current. In the case of a multiple semiconductor fins, the use of implant regions, the dopant conductivity type in the implant regions and/or the sizes of the implant regions can be varied from fin to fin within a multi-fin MUGFET or between different single and/or multi-fin MUGFETs so that individual device drive current can be optimized. Also disclosed herein are embodiments of a method of forming the semiconductor structure.

16 Claims, 7 Drawing Sheets

OTHER PUBLICATIONS

Iyengar et al., "Extraction of the Top and Sidewall Mobility in FinFETs and the Impact of Fin-Patterning Processes and Gate Dielectrics on Mobility", IEEE Transactions on Electron Devices, vol. 54, No. 5, May 2007, pp. 1177-1184.

Burenkov et al., "Corner Effect in Double and Triple Gate FinFETs", European Solid-State Device Research, 2003. ESSDERC '03. 33rd Conference, Sep. 2003, pp. 135-138.

* cited by examiner

MULTI-GATE NON-PLANAR FIELD EFFECT TRANSISTOR STRUCTURE AND METHOD OF FORMING THE STRUCTURE USING A DOPANT IMPLANT PROCESS TO TUNE DEVICE DRIVE CURRENT

BACKGROUND

1. Field of the Invention

The embodiments of the invention generally relate to multi-gate non-planar field effect transistors (MUGFETS) and, more particularly, to a MUGFET structure and method of forming the structure using a dopant implant process to tune device drive current.

2. Description of the Related Art

Integrated circuit design decisions are often driven by device scalability and manufacturing efficiency. For example, size reduction of single-gate planar field effect transistors resulted in reduced device drive current because channel width is directly associated with the drive. In response, multi-gate non-planar field effect transistors (MUGFETs), such as double-gate FETs (e.g., fin-type FETs (FINFETs)) or tri-gate FETs, were developed to provide scaled devices with increased drive current and reduced short channel effects. However, there is a need in the art for a MUGFET structure and method of forming the structure that allows device drive current to be optimized (i.e., selectively adjusted), while minimizing additional processing, costs, etc.

SUMMARY

In view of the foregoing, disclosed herein are embodiments of a semiconductor structure comprising one or more multi-gate non-planar field effect transistors (MUGFETs), each MUGFET comprising one or more semiconductor fins. In the embodiments, a dopant implant region is incorporated into the upper portion of the channel region of a semiconductor fin in order to selectively modify (i.e., decrease or increase) the threshold voltage within that upper portion relative to the threshold voltage in the lower portion and, thereby to selectively modify (i.e., decrease or increase) device drive current. In the case of multiple semiconductor fins, the use of implant regions, the dopant conductivity type in the implant regions and/or the sizes of the implant regions can be varied from fin to fin within a multi-fin MUGFET or between different single and/or multi-fin MUGFETs so that individual device drive current can be optimized (i.e., selectively adjusted). Also disclosed herein are embodiments of a method of forming the semiconductor structure.

The embodiments of the semiconductor structure can comprise a substrate and a first MUGFET, having a first conductivity type, on the substrate. The first MUGFET can comprise a first semiconductor fin. The first semiconductor fin can comprise a first channel region and a first implant region. The first channel region can have a first top surface. The first implant region can be positioned within the first channel region at the first top surface. The first implant region can comprise a first dopant, which causes the threshold voltage of a first upper portion of the first channel region to be different than the threshold voltage of a first lower portion of the first channel region. Specifically, this first dopant can have a second conductivity type different from the first conductivity type such that the threshold voltage of the first upper portion of the first channel region is greater than the threshold voltage of the first lower portion of the first channel region. This, in effect, turns off the top of the first channel region reducing the effective channel width and, thereby reducing device drive current. Alternatively, the first dopant can have the first conductivity type such that the threshold voltage of the first upper portion of the first channel region is less than the threshold voltage of the first lower portion. This, in effect, turns on the top of the first channel region increasing the effective channel width and, thereby increasing device drive current.

The embodiments of the semiconductor structure can further comprise one or more additional first semiconductor fins incorporated into the first MUGFET and/or one or more second semiconductor fins incorporated into a second MUGFET. The additional first semiconductor fins of the first MUGFET and the second semiconductor fins of the second MUGFET can be configured without implant regions, with implant regions comprising the same dopant and/or with implant regions comprising different dopants in order to tune (i.e., to selectively increase or decrease) device drive current. Optionally, the sizes of any implant regions that are incorporated into the semiconductor fins of the first MUGFET and/or the second MUGFET can vary in order to further tune device drive current.

The method embodiments can comprise providing a substrate and forming a plurality of semiconductor fins on the substrate. During the semiconductor fin formation process, at least one first semiconductor fin for a first MUGFET, having a first conductivity type, is formed on the substrate. This first semiconductor fin can comprise a first channel region having a first top surface. The method embodiments can further comprise performing a first dopant implant process so as to form a first implant region within the first channel region of the first semiconductor fin at the top surface. This first dopant can be pre-selected so that it causes the threshold voltage of a first upper portion of the first channel region to be different from that of a first lower portion of the first channel region. Specifically, the pre-selected first dopant can have a second conductivity type (i.e., a conductivity type different from the first MUGFET) such that it causes the threshold voltage of the first upper portion of the first channel region to be greater than the threshold voltage of the first lower portion of the first channel region. This, in effect, turns off the top of the first channel region reducing the effective channel width and, thereby reducing device drive current. Alternatively, the pre-selected first dopant can have the first conductivity type (i.e., the same conductivity type as the first MUGFET) such that it causes the threshold voltage of the first upper portion of the first channel region to be less than the threshold voltage of the first lower portion. This, in effect, turns on the top of the first channel region increasing the effective channel width and, thereby increasing device drive current.

The embodiments of the method can also comprise forming, on the substrate, one or more additional first semiconductor fins for incorporation into the first MUGFET and/or one or more second semiconductor fins for incorporation into a second MUGFET. In order to tune device drive current, the additional first semiconductor fin(s) and/or the second semiconductor fin(s) can optionally be implanted, during the first dopant implant process, with the first dopant or, during a second dopant implant process, with a second dopant, having a different conductivity type. In order to further tune device drive current, the implant regions may be formed with varying sizes from fin to fin within the MUGFETs and/or between the MUGFETS.

These and other features are described in, or are apparent from, the following detailed description.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As mentioned above, integrated circuit design decisions are often driven by device scalability and manufacturing efficiency. For example, size reduction of single-gate planar field effect transistors resulted in reduced device drive current because channel width is directly associated with the drive. In response, multi-gate non-planar field effect transistors (MUGFETs), such as double-gate FETs (e.g., fin-type FETs (FINFETs)) or tri-gate FETs, were developed to provide scaled devices with increased drive current and reduced short channel effects.

Specifically, a FINFET is a non-planar FET in which a fully depleted channel region is formed in the center of a thin semiconductor fin with source and drain regions in the opposing ends of the fin adjacent to the channel region. A gate is formed over the top surface and each side of the thin fin in an area corresponding to the channel region to provide two-dimensional field effects. A dielectric cap layer (such as a nitride cap layer) typically isolates the top surface of the channel region from the gate so that two-dimensional field effects are exhibited. The effective channel width is determined by the fin height. Additionally, a fin thickness of approximately one-fourth (or less) the length of the gates can ensure suppression of deleterious short-channel effects, such as variability in threshold voltage and excessive drain leakage currents.

Tri-gate FETs are similar in structure to FINFETs, except that the fins of tri-gate FETS are wider. Additionally, a dielectric cap layer is not used. Thus, the gate, which is formed over the top surface and each side of the fin, causes three-dimensional field effects to be exhibited. Typically, the fin height to width ratio in a tri-gate FET is in the range of 3:2 to 2:3 so that the channel will remain fully depleted and so that the resulting three-dimensional field effects will provide greater device drive current and improved short-channel characteristics over a planar transistor.

The effective channel width of MUGFETs (e.g., of FINFETs or tri-gate FETs) and, thereby, the device drive current can be increased by using multiple semiconductor fins. For a detail discussion of the structural differences between dual-gate finFETs and tri-gate MOSFETs see "Dual-gate (finFET) and Tri-Gate MOSFETs: Simulation and Design" by A Breed and K. P. Roenker, Semiconductor Device Research Symposium, 2003, pages 150-151, December 2003 (incorporated herein by reference). However, for multi-fin MUGFETs quantization is a significant issue. That is, if device drive current is not optimized, quantization can result in additional power and lower performance. Existing solutions include optimizing device drive current by adjusting fin height, by adjusting gate dielectric widths and/or by adjusting threshold voltage (Vt). For example, U.S. Pat. No. 6,909,147 of Aller et al., issued on Jun. 21, 2005, assigned to International Business Machines Corporation, Armonk, N.Y. and incorporated herein by reference, discloses a multi-fin MUGFET structure with semiconductor fins having different heights to tune performance. However, tradeoffs are associated with each of these alternatives and these tradeoffs typically include additional processing, which adds to the wafer cost and development complexity. Therefore, there is a need for a MUGFET structure and method of forming the structure that allows device drive current to be optimized (i.e., selectively adjusted), while minimizing additional processing, costs, etc.

In view of the foregoing, disclosed herein are embodiments of a semiconductor structure that comprises one or more MUGFETs, with each MUGFET comprising one or more semiconductor fins. In the embodiments, a dopant implant region is incorporated into the channel region of a semiconductor fin in order to selectively modify (i.e., decrease or increase) the threshold voltage of the upper portion of the channel region relative to the threshold voltage of the lower portion of the channel region and, thereby to selectively adjust (i.e., decrease or increase, respectively) device drive current. For example, if a second conductivity type dopant is implanted at the top surface of the channel region of a semiconductor fin in a first conductivity type MUGFET, the threshold voltage of the upper portion of the channel region will be greater than that of the lower portion. This, in effect, turns off the top of the channel region reducing the effective channel width and, thereby reducing device drive current. However, if the same second conductivity type dopant is implanted at the top surface of the channel region of a semiconductor fin of a second conductivity type MUGFET, the threshold voltage of the upper portion of the channel region will be less than that of the lower portion. This, in effect, turns on the top of the channel region increasing the effective channel width and, thereby increasing drive current. In the case of multiple semiconductor fins, the use of implant regions, the dopant conductivity type in the implant regions and/or the sizes of the implant regions can be varied from fin to fin within a MUGFET or between different MUGFETs so that individual device drive current can be optimized. Also disclosed herein are embodiments of a method of forming the semiconductor structure.

It should be noted that, for illustration purposes, in the embodiments described below, the first conductivity type is referred to as n-type conductivity and the second conductivity type is referred to as p-type conductivity. However, alternatively, the first conductivity type could comprise p-type conductivity and the second conductivity type could comprise n-type conductivity. Additionally, those skilled in the art will recognize that n-type dopants can be comprise, for example, Group V dopants, such as arsenic (As), phosphorous (P) or antimony (Sb), whereas p-type dopants can comprise, for example, Group III dopants, such as boron (B). It should further be noted that in the embodiments described below "multi-gate non-planar field effect transistors (MUGFETS)" can comprise either double-gate non-planar FETs (i.e., FIN-FETs) or tri-gate non-planar FETs (tri-gate FETs), as described in the "Description Of Related Art" section above. However, for illustration purposes, FINFETs are shown in the Figures. Finally, it should be understood that in the embodiments described below the term "semiconductor fin" refers to an essentially rectangular shaped body of semiconductor material (e.g., silicon, silicon germanium, etc.), the height to width ratio of which will vary depending upon whether it is incorporated into a FINFET or a tri-gate FET.

Figure 1:
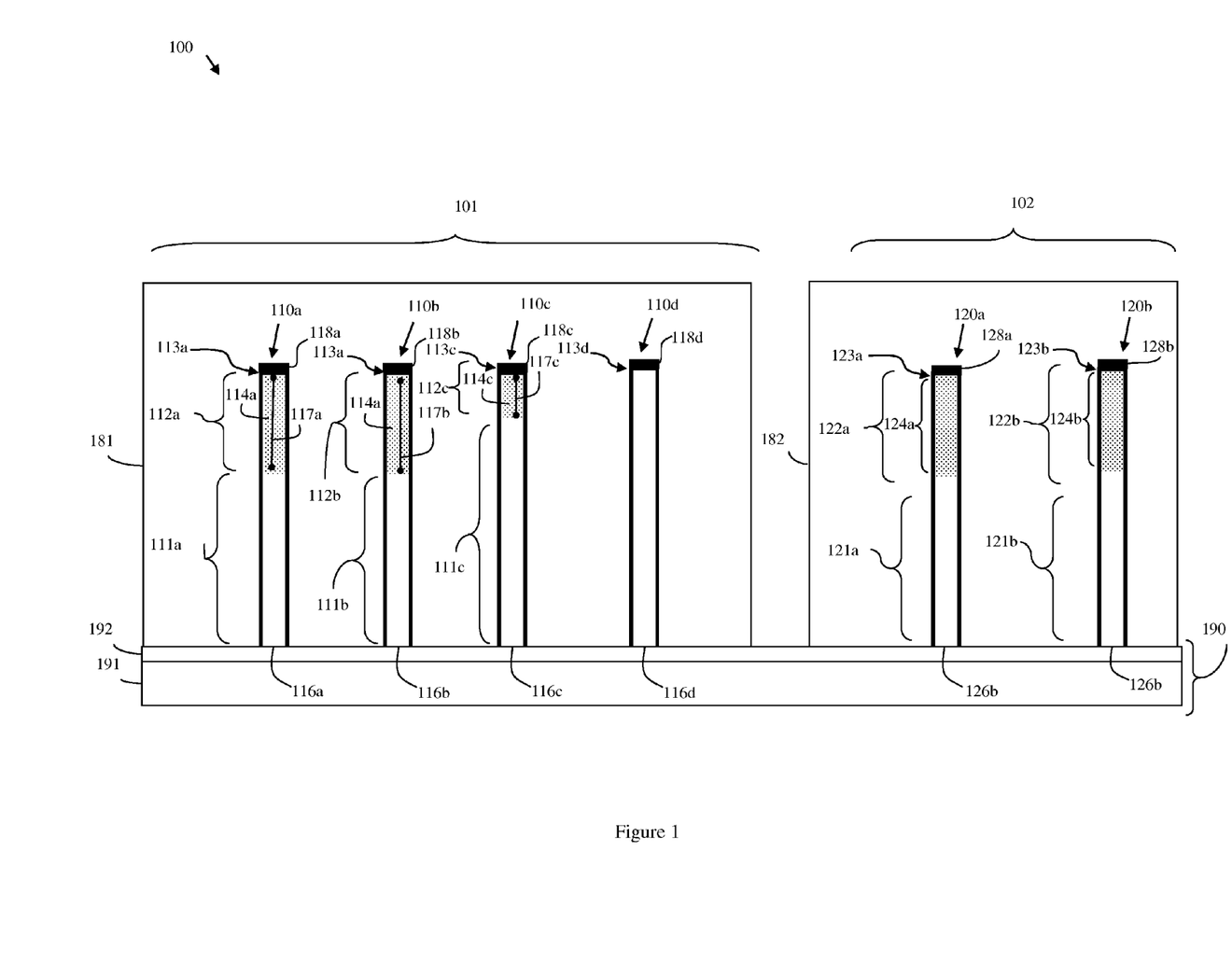
FIG. 1 is a schematic diagram illustrating embodiments of a semiconductor structure.

FIG. 1 is a schematic diagram illustrating a cross-section view of a semiconductor structure 100 according to the embodiments disclosed herein. This cross-section view shows a vertical plane perpendicular to and traversing the center regions (i.e., the channel regions) of a plurality of parallel semiconductor fins. Referring to FIG. 1, the semiconductor structure 100 can comprise a substrate 190. A first multi-gate non-planar field effect transistor (MUGFET) 101, having a first conductivity type, can be positioned on the substrate 190.

The first MUGFET 101 can comprise at least one first semiconductor fin (i.e., see first semiconductor fin 110a). This first semiconductor fin 110a can comprise a first channel region 116a and a first implant region 114a. The first channel region 116a can have a first top surface 113a. The first implant region 114a can be positioned within the first channel region 116a at the first top surface 113a (i.e., immediately adjacent to the first top surface 113a and extending a depth 117a into the first semiconductor fin 110a). The first implant region 114a can comprise a first dopant. The conductivity type of this dopant (e.g., n-type dopant or p-type dopant) as well as the concentration can be pre-selected so that the first implant region 114a selectively modifies (i.e., increases or decreases) the threshold voltage within the first upper portion 112a of the first channel region 116a relative to the threshold voltage of the first lower portion 111a of the first channel region 116a. Specifically, in one embodiment of the structure 100, the first dopant in the first implant region 114a can have a second conductivity type that is different from the first conductivity type of the first MUGFET 101 such that the threshold voltage of the first upper portion 112a of the first channel region 116a is greater than the threshold voltage of the first lower portion 111a of the first channel region 116a. For example, the first MUGFET 101 can comprise a n-type MUGFET and the first dopant can comprise a p-type dopant. This, in effect, turns off the top of the first channel region 116a reducing the effective channel width and, thereby reducing device 101 drive current. Alternatively, in another embodiment of the structure 100, the first dopant in the first implant region 114a can have the same first conductivity type as the first MUGFET 101 such that the threshold voltage of the first upper portion 112a of the first channel region 116a is less than the threshold voltage of the first lower portion 112a of the first channel region 116a. For example, the first MUGFET 101 can comprise a n-type MUGFET and the first dopant can comprise a n-type dopant. This, in effect, turns on the top of the first channel region 116a, increasing the effective channel width and, thereby increasing device 101 drive current.

Optionally, the embodiments of the semiconductor structure 100 can further comprise one or more additional first semiconductor fins 110b-d incorporated into the first MUGFET 101 to form a multi-fin MUGFET and/or one or more second semiconductor fins 130a-b incorporated into a second MUGFET 102 (e.g., see semiconductor fin 130). As discussed in more detail below, the additional first semiconductor fin(s) of the first MUGFET 101 and the second semiconductor fin(s) of the second MUGFET 102 can be configured without implant regions, with implant regions comprising the same dopant as that used in the first implant region and/or with implant regions having different dopants than that used in the first implant region in order to tune (i.e., selectively increase or decrease) device drive current. Furthermore, also as discussed in more detail below, the sizes of any implant regions that are incorporated into the semiconductor fins of the first and/or second MUGFETS 101,102 can vary in order to further tune device drive current.

More specifically, the embodiments of the semiconductor structure 100 can comprise a substrate 190. This substrate 190 can comprise a semiconductor layer 191 (e.g., a silicon layer or other suitable semiconductor layer) and an insulator layer 192 (e.g., an oxide layer or other suitable insulator layer) on the semiconductor layer 191.

A first multi-gate non-planar field effect transistor (MUGFET) 101, having a first conductivity type, can be positioned on the substrate 190. For example, the first MUGFET 101 can comprise an n-FET. The first MUGFET 101 can comprise at least one first semiconductor fin (e.g., see first semiconductor fin 110a).

Figure 2:
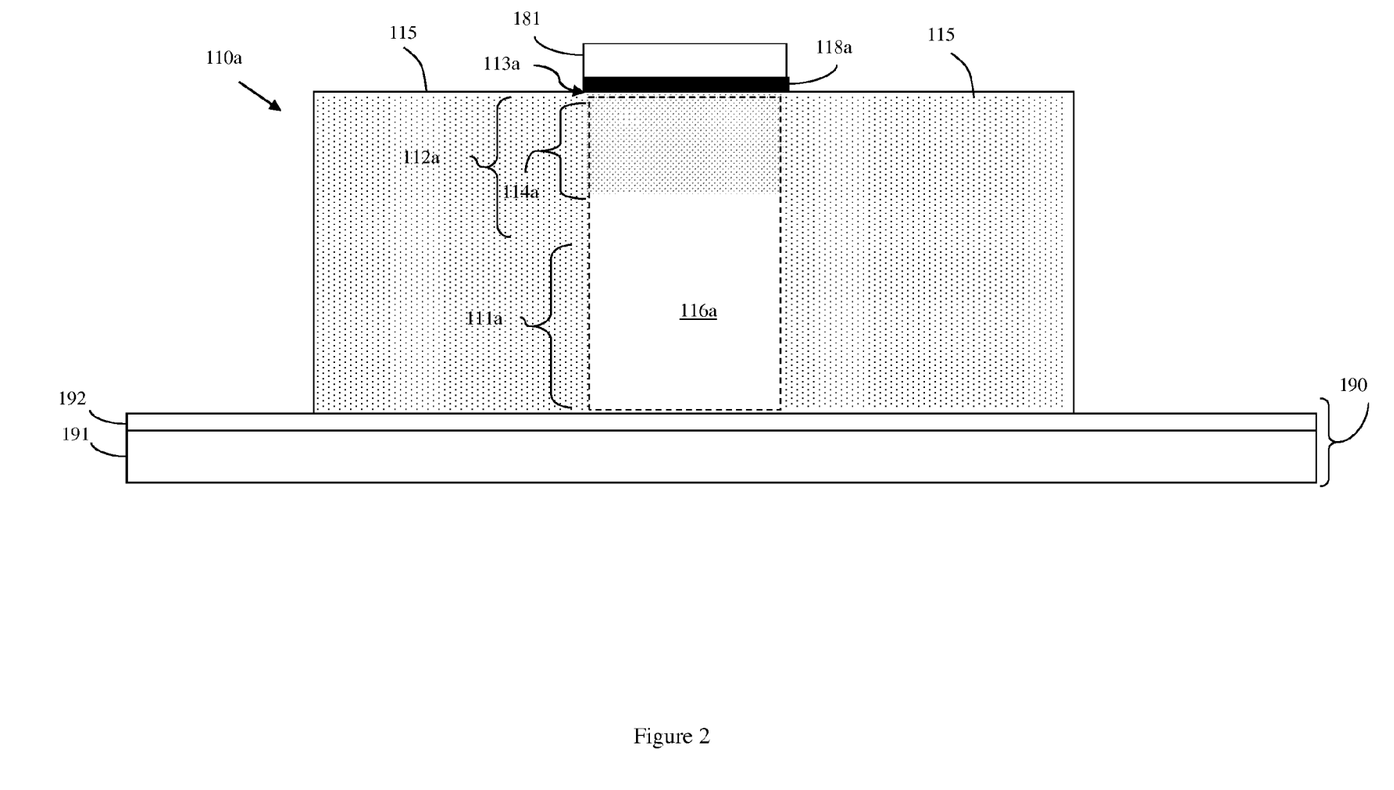
FIG. 2 is cross-section view diagram through a plane extending parallel to and through the center of a single semiconductor fin in the semiconductor structure of FIG. 1.

FIG. 2 is a cross-section diagram of the semiconductor structure 100 through a plane extending parallel to and through the center of the first semiconductor fin 110a. Referring to FIG. 2 in combination with FIG. 1, the first semiconductor fin 110a can comprise, for example, a first channel region 116a, first source/drain regions 115, first source/drain extension regions, first halo regions and a first implant region 114a. The first channel region 116a can be located within the center portion of the first semiconductor fin 110a and can have a first top surface 113a and first opposing sidewalls. A gate 181, including a gate dielectric layer and a gate conductor layer, can be positioned adjacent to the first channel region 116a above the first top surface 113a and on the first opposing sidewalls. In the case of a FINFET, the first top surface 113a of the first channel region 116a can be isolated from the gate 181 by a dielectric cap 118a. The first source/drain regions 115 can be positioned within the ends of the first semiconductor fin 110a on opposite sides of the first channel region 116a. The first source/drain regions 115 can be heavily doped with a first conductivity type dopant (e.g., n+ doped) and the first channel region 116a can be lightly doped with a second conductivity type dopant (p− doped). The first source/drain extension regions and/or first halo regions can separate the first channel region 116a from the first source/drain regions 115. Source/drain extension regions and halo regions are well-known in the art and, thus, the details and illustrations of such features are omitted from this specification in order to allow the reader to focus on the salient aspects of the embodiments described herein. The first implant region 114a can comprise a first dopant and can be positioned within the first channel region 116a at the first top surface 113a.

Optionally, in each of the embodiments of the semiconductor structure 100, the first MUGFET 101 can comprise a multi-fin MUGFET. This multi-fin MUGFET 101 can comprise one or more additional first semiconductor fins 110b-d. The additional first semiconductor fin(s) 110b-c can be approximately equal in size (i.e., height, width, length) to the first semiconductor fin 110a. Each additional first semiconductor fin 110b-c can comprise an additional first channel region 116b-d, additional first source/drain regions, additional first source/drain extensions regions, additional first halo regions, etc. Each additional first channel region 116b-d can have an additional first top surface 113b-d and additional first opposing sidewalls. The gate 181 can further be positioned adjacent to the additional first top surfaces 113b-d and the additional first opposing sidewalls of the additional first channel regions 116b-d. In the case of a FINFET, the additional first top surfaces 113b-d of the additional first channel regions 116b-d can be isolated from the gate 181 by dielectric caps 118b-d.

Also, optionally, in each of the embodiments of the semiconductor structure 100, the semiconductor structure 100 can further comprise a second multi-gate non-planar field effect transistor (MUGFET) 102 on the substrate 190. The second MUGFET 102 can comprise a single-fin MUGFET or, alternatively, a multi-fin MUGFET (as shown). The second MUGFET 102 can have a second conductivity type different from the first conductivity type of the first MUGFET 101. For example, the second MUGFET 102 can comprise a p-FET. Specifically, this second MUGFET 102 can comprise at least one second semiconductor fin (see second semiconductor fins 120a-b). Each second semiconductor fin 120a-b can be approximately equal in size (i.e., height, width, length) to the first semiconductor fin(s). Each second semiconductor fin 120a-b can comprise a second channel region 126a-b, second source/drain regions, second source/drain extensions regions, second halo regions, etc. The second channel regions 126a-b can be located within center portions of the second semiconductor fins 120a-b and can have second top surfaces 123a-b and second opposing sidewalls. A gate 182, including a gate dielectric layer and a gate conductor layer, can be positioned adjacent to the second channel regions 126a-b above the second top surfaces 123a-b and on the second opposing sidewalls. In the case of a FINFET, the second top surfaces 123a-b of the second channel regions 126a-b can be isolated from the gate 182 by dielectric caps 128a-b.

In one embodiment of the semiconductor structure 100, a first implant region 114a can be positioned within and at the first top surface 113a of the first channel region 116a of the first semiconductor fin 110a of the first MUGFET 101. The first implant region 114a can comprise a first dopant having a second conductivity type (e.g., p-type). As mentioned above, the first MUGFET 101 can have a first conductivity type (e.g., n-type). Thus, the conductivity type of the first dopant in the first implant region 114a (e.g., p-type) is different from the conductivity type (e.g., n-type) of the first MUGFET 101 and the threshold voltage of a first upper portion 112a of the first channel region 116a of the first semiconductor fin 110a will be greater than the threshold voltage of a first lower portion 111a of the first channel region 116a.

Additionally, in this embodiment, any one or more of the additional first semiconductor fin(s) 110b-d in the first MUGFET 101 can be configured with similar implant regions (e.g., see the additional first implant regions 114b-c within and at the additional first top surfaces 113b-c of the additional first channel regions 116b-c in the additional first semiconductor fins 110b-c, respectively) or can be configured without such implant regions (e.g., see the additional first channel region 116d of the additional first first semiconductor fin 110c). For example, an additional first implant region 114b can be positioned within the additional first channel region 116b of the additional first semiconductor fin 110b at the top surface 113b. The additional first implant region 114b can comprise the first dopant (e.g., the same p-type dopant as that used to form the first implant region 114a) such that the threshold voltage of the additional first upper portion 112b of the additional first channel region 116b of the additional first semiconductor fin 110b is greater than the threshold voltage of the additional first lower portion 111b the additional first channel region 116b. Alternatively or additionally, an additional first implant region 114c can be positioned within the additional first channel region 116c of the additional first semiconductor fin 110c at the additional first top surface 113c. However, this additional first implant region 114c can comprise a second dopant that is different from the first dopant. Specifically, the second dopant can have a first conductivity type (e.g., n-type) such that the threshold voltage of the additional first upper portion 112c of the additional first channel region 116c in the additional first semiconductor fin 110c is less than the threshold voltage of the additional first lower portion 111c of the additional first channel region 116c.

Furthermore, as mentioned above, the second MUGFET 101 in each of the embodiments can have a second conductivity type (e.g., p-type), In this embodiment, any one or more of the second semiconductor fins 120a-b in the second MUGFET 102 can be configured with similar implant regions (e.g., see second implant regions 124a-b within and at the second top surfaces 123a-b of the second channel regions 126a-b in the second semiconductor fins 120a-b, respectively) or can be configured without implant regions (not shown). These second implant regions 124a-b can comprise either the first dopant (i.e., the same second conductivity type dopant as in the first implant region 114a of the first semiconductor fin 110) or a second dopant (i.e., a different conductivity type dopant than that used in the first implant region 114a of the first semiconductor fin 110a). For example, the second implant region 124a in the second semiconductor fin 120a can comprise the first dopant (e.g., the same p-type dopant as used in the first implant region 114a of the first semiconductor fin 110a) such that the threshold voltage of a second upper portion 122a of the second channel region 126a of the second semiconductor fin 120a is less than the threshold voltage of a second lower portion 121a of the second channel region 126a. Alternatively or additionally, the second implant region 124b in the second semiconductor fin 120b can comprise a second dopant having a different conductivity type than the first dopant (e.g., a n-type dopant) such that the threshold voltage of a second upper portion 122b of the second channel region 126b of the second semiconductor fin 120b is greater than the threshold voltage of a second lower portion 121b of the second channel region 126b.

In an alternative embodiment of the semiconductor structure 100, a first implant region 114a can be positioned within and at the first top surface 113a of the first channel region 116a of the first semiconductor fin 110a of the first MUGFET 101. The first implant region 114a can comprise a first dopant. However, in this alternative embodiment, the first dopant can have a first conductivity type (e.g., n-type). As mentioned above, the first MUGFET 101 can also have the first conductivity type (e.g., n-type). Thus, the conductivity type of the first dopant in the first implant region 114a (e.g., p-type) is the same as the conductivity type (e.g., n-type) of the first MUGFET 101 and the threshold voltage of a first upper portion 112a of the first channel region 116a of the first semiconductor fin 110a will be less than the threshold voltage of a first lower portion 111a of the first channel region 116a.

Additionally, in this alternative embodiment as in the previously described embodiment, any one or more of the additional first semiconductor fin(s) 110b-d in the first MUGFET 101 can be configured with similar implant regions (e.g., see the additional first implant regions 114b-c within and at the additional first top surfaces 113b-c of the additional first channel regions 116b-c in the additional first semiconductor fins 110b-c, respectively) or can be configured without such implant regions (e.g., see the additional first channel region 116d of the additional first semiconductor fin 110c). For example, an additional first implant region 114b can be positioned within the additional first channel region 116b of the additional first semiconductor fin 110b at the top surface 113b. The additional first implant region 114b can comprise the first dopant (e.g., the same n-type dopant as that used to form the first implant region 114a) such that the threshold voltage of the additional first upper portion 112b of the additional first channel region 116b of the additional first semiconductor fin 110b is less than the threshold voltage of the additional first lower portion 111b the additional first channel region 116b. Alternatively or additionally, an additional first implant region 114c can be positioned within the additional first channel region 116c of the additional first semiconductor fin 110c at the additional first top surface 113c. This additional first implant region 114c can comprise a second dopant that is different from the first dopant. Specifically, the second dopant can have a second conductivity type (e.g., p-type) such that the threshold voltage of the additional first upper portion 112c of the additional first channel region 116c in the additional first semiconductor fin 110c is greater than the threshold voltage of the additional first lower portion 111c of the additional first channel region 116c.

Furthermore, as mentioned above, the second MUGFET 101 in each of the embodiments can have a second conductivity type (e.g., p-type). In this alternative embodiment as in the previously described embodiment, any one or more of the second semiconductor fins 120a-b in the second MUGFET 102 can be configured with similar implant regions (e.g., see second implant regions 124a-b within and at the second top surfaces 123a-b of the second channel regions 126a-b in the second semiconductor fins 120a-b, respectively) or can be configured without implant regions (not shown). These second implant regions 124a-b can comprise either the first dopant (i.e., the same first conductivity type dopant as in the first implant region 114a of the first semiconductor fin 110) or a second dopant (i.e., a different conductivity type dopant than that used in the first implant region 114a of the first semiconductor fin 110a). For example, the second implant region 124a in the second semiconductor fin 120a can comprise the first dopant (e.g., the same n-type dopant as used in the first implant region 114a of the first semiconductor fin 110a) such that the threshold voltage of a second upper portion 122a of the second channel region 126a of the second semiconductor fin 120a is greater than the threshold voltage of a second lower portion 121a of the second channel region 126a. Alternatively or additionally, the second implant region 124b in the second semiconductor fin 120b can comprise a second dopant having a different conductivity type than the first dopant (e.g., a p-type dopant) such that the threshold voltage of a second upper portion 122b of the second channel region 126b of the second semiconductor fin 120b is less than the threshold voltage of a second lower portion 121b of the second channel region 126b.

It should be noted that, in each of the embodiments described above, the implant regions 114a-c in the first semiconductor fins 110a-c of the first MUGFET 101 and/or the implant regions 124a-b in the second MUGFET 102 can be approximately equal in size or can vary in size. For example, as illustrated in FIG. 1, the depth 117a of the first implant region 114a in the first semiconductor fin 110a is approximately equal to the depth 117b of the additional first implant region 114b in the additional first semiconductor fin 110b, but different than the depth 117c of the additional first implant region 114c in the additional first semiconductor fin 110c. By selectively configuring the various semiconductor fins 110a-d in the first MUGFET 101 and the various semiconductor fins 120a-b in the second MUGFET, without implant regions, with implant regions comprising the same dopant as that used in the first implant region, with implant regions having different dopants than that used in the first implant region and/or with implant regions having different sizes, the drive currents of the devices 101 and 102 can be selectively tuned (i.e., selectively increased or decreased).

Figure 3:
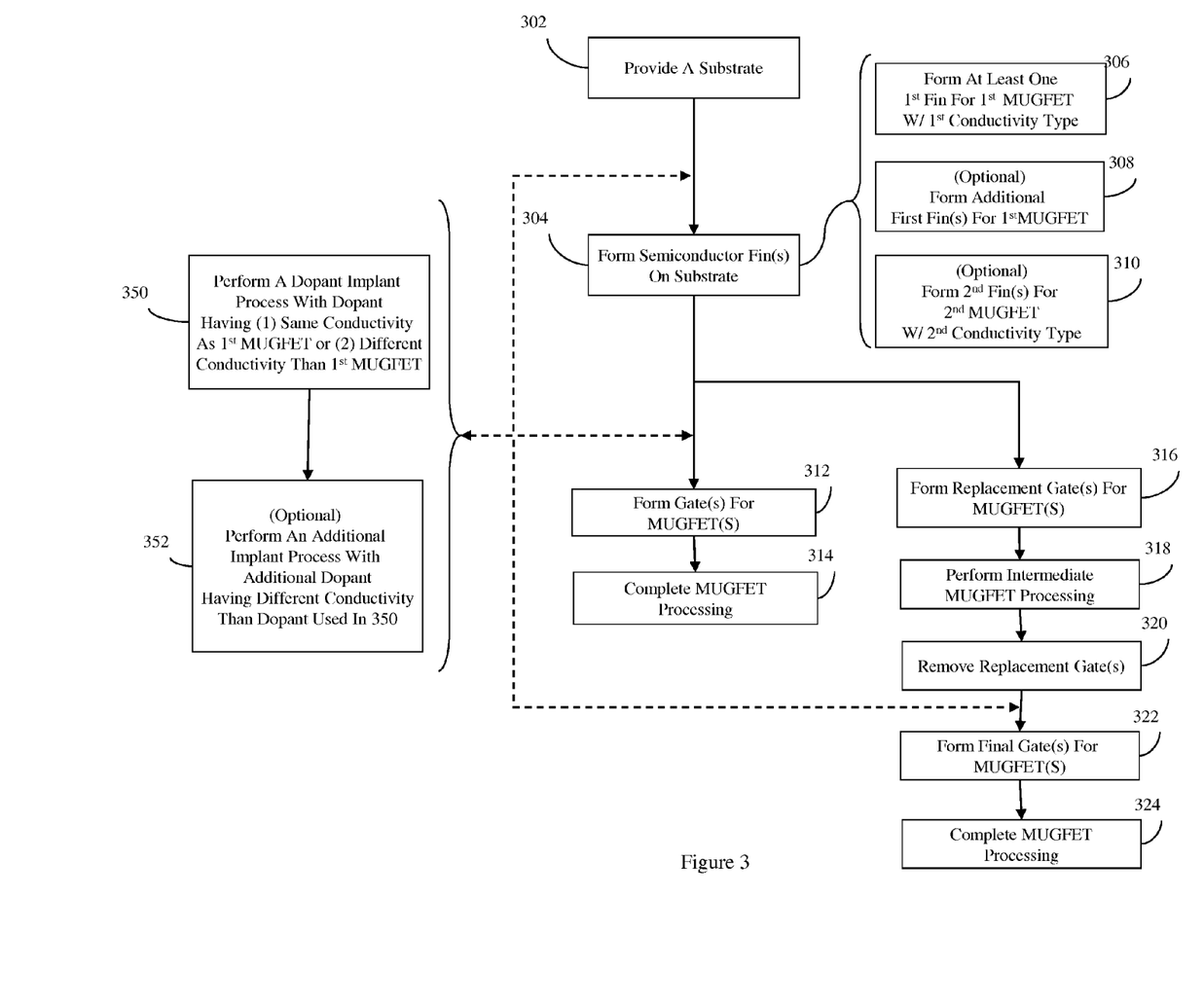
FIG. 3 is a flow diagram illustrating embodiments of a method of forming the semiconductor structure of FIG. 1.

FIG. 3 is a flow diagram illustrating the embodiments of the method of forming the semiconductor structure 100, as described above and illustrated in FIG. 1, that comprises one or more MUGFETs 101, 102 with each MUGFET comprising one or more semiconductor fins 110a-d, 120a-b. The method embodiments can comprise forming the semiconductor structure 100 using conventional MUGFET processing techniques and further incorporating one or more dopant implant processes (see steps 350 and 352) in order to form the implant regions, as discussed above, that allow device drive current to be selectively tuned.

Figure 4:
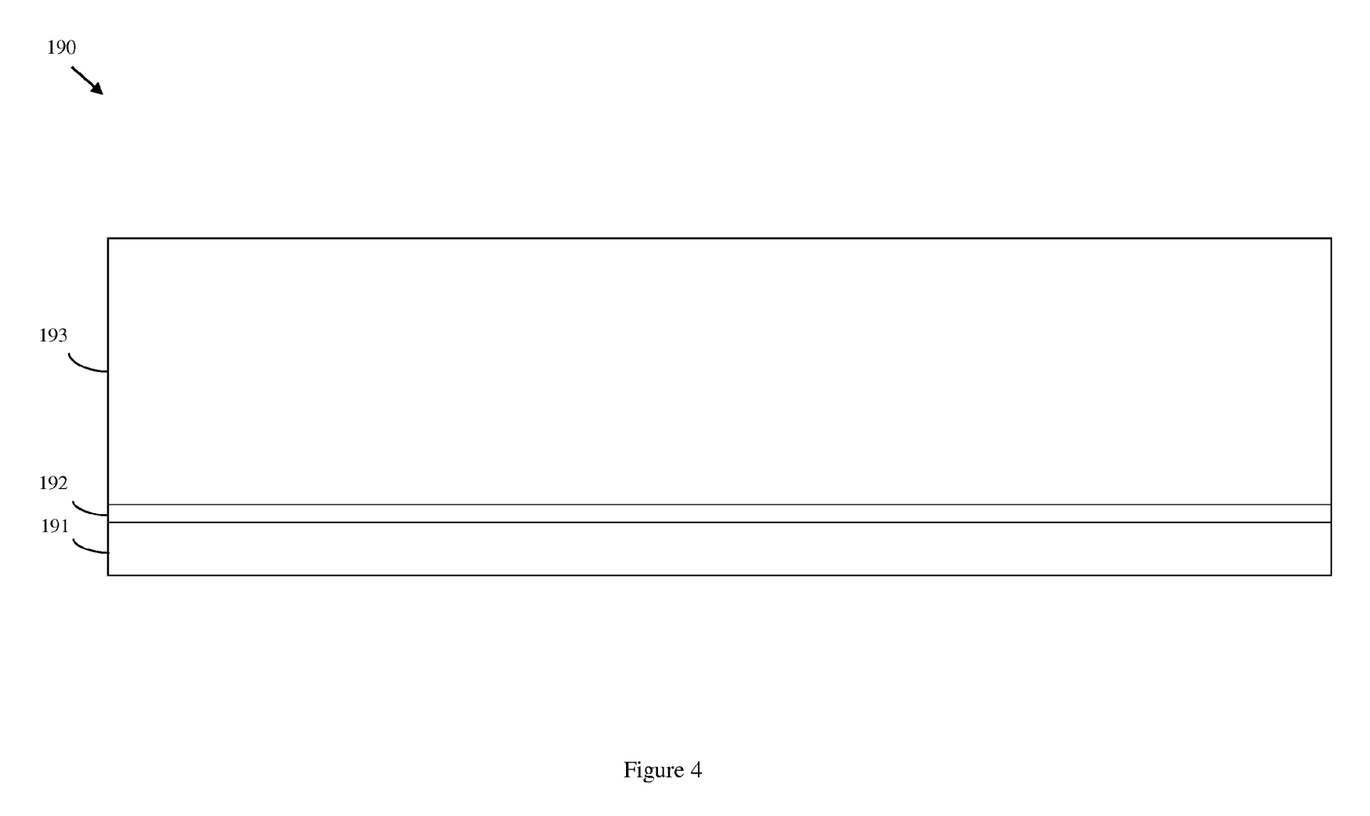
FIG. 4 is a schematic diagram illustrating a partially completed semiconductor structure formed according to the method of FIG. 3.

More specifically, the embodiments of the method disclosed herein can comprise providing a substrate 190 (302, see FIG. 4). The substrate 190 can comprise, for example, a silicon-on-insulator (SOI) wafer comprising semiconductor substrate 191 (e.g., a silicon substrate), an insulator layer 192 (e.g., an oxide layer) on the semiconductor substrate 191, and a semiconductor layer 193 (e.g., a silicon layer, a silicon germanium layer, etc.) on the insulator layer 192. A plurality of semiconductor fins 500 can be formed on the substrate 190 and, particularly, from the semiconductor layer 193 (304, see FIG. 5).

Figure 5:
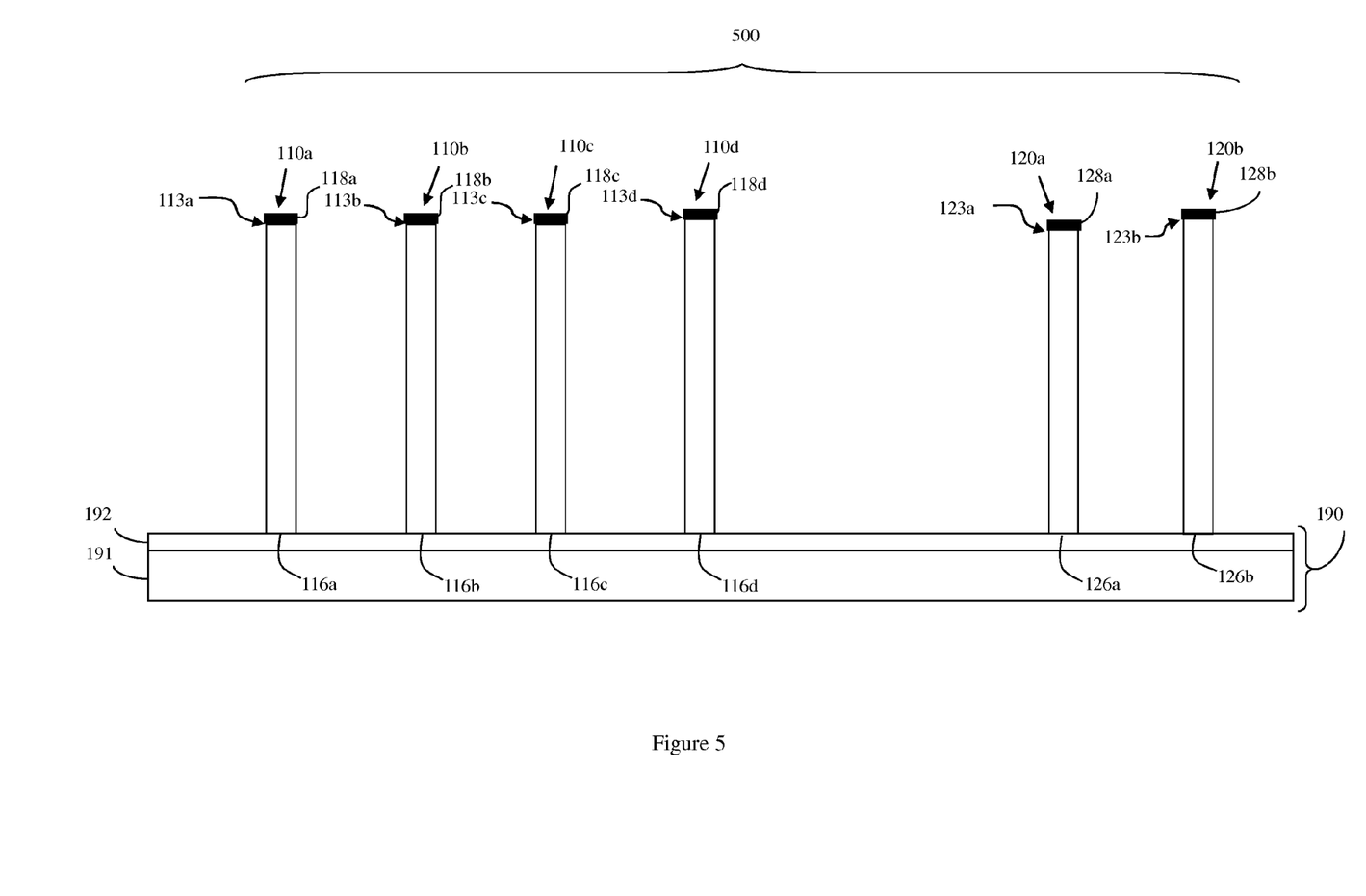
FIG. 5 is a schematic diagram illustrating a partially completed semiconductor structure formed according to the method of FIG. 3.

During the semiconductor fin formation process 304, at least a first semiconductor fin 110a is formed on the substrate 190 for incorporation into a first MUGFET 101, having a first conductivity type (e.g., n-type conductivity) (306, see FIG. 5). Optionally, one or more additional first semiconductor fins can simultaneously be formed on the substrate 190 for incorporation into the first MUGFET 101 (e.g., see additional first semiconductor fins 110b-d) (308) and/or one or more second semiconductor fins can simultaneously be formed on the substrate 190 for incorporation into a second MUGFET 102 e.g., see second semiconductor fins 120a-b) (310). All of the semiconductor fins 110a-d and 120a-b can be formed such that they are approximately equal in size (i.e., height, width, length). Additionally, these semiconductor fins 110a-d and 120a-b can be formed such that they each have a corresponding designated channel region 116a-d and 126a-d with a top surface 113a-d and 123a-b. In the event that the MUGFETs 101, 102 are to be FINFETs, the semiconductor fins 110a-d and 120a-b can be formed such that the top surfaces 113a-d and 123a-b are covered by nitride caps 118a-d and 128a-b.

Following semiconductor fin formation at process 304, known processing techniques can be used to form the various components of MUGFETs 101, 102. For example, a thin conformal gate dielectric layer (e.g., a gate oxide layer or other suitable gate dielectric layer) can be formed adjacent to the channel regions 116, 126a-c and 136 of the semiconductor fins 110, 120a-c and 130. Then, a blanket gate conductor layer (e.g., a gate polysilicon layer or other suitable gate conductor layer) can be deposited. The gate dielectric layer and gate conductor layer can then be patterned in order to form the gates 181, 182 for the MUGFETs 101, 102, as shown in FIG. 1 (312). Additional processing can then be performed in order to complete the MUGFETs 101, 102 (314). This additional processing can include, but is not limited to, halo formation, gate sidewall spacer formation, source/drain extension formation, source drain region formation, silicide formation, interlayer dielectric formation, contact formation, etc.

Alternatively, a replacement gate process can be used (e.g., if the designers prefer to use a metal gate conductor over a polysilicon gate conductor). That is, replacement gates (i.e., sacrificial gates) can be formed for the MUGFETs 101, 102 using, for example, the same processes as discussed above in step 312 (316). Then, intermediate MUGFET processing can be performed (318). This intermediate processing can include, but is not limited to, halo formation, gate sidewall spacer formation, source/drain extension formation, source drain region formation, silicide formation, interlayer dielectric deposition and planarization, etc. Following interlayer dielectric deposition and planarization, exposed replacement gates can be selectively removed and replaced with metal gates as to form the final gates 181, 182, as shown in FIG. 1 (320). Additional processing can then be performed in order to complete the MUGFETs 101, 102 (322). This additional processing can include, but is not limited to, halo formation, gate sidewall spacer formation, source/drain extension formation, source drain region formation, silicide formation, interlayer dielectric formation, contact formation, etc.

It should be noted that the techniques for forming the above-mentioned components of non-planar multi-gate field effect transistors (MUGFETs) 101, 102 including, but not limited to, the semiconductor fins, halos, gate sidewall spacers, source/drain extensions, source drain, silicide layers, interlayer dielectrics, contacts, etc., are well-known. Thus, the details of such techniques are omitted from this specification in order to allow the reader to focus on the salient aspects of the method embodiments described herein.

As mentioned above, in addition to known MUGFET processing techniques, the method embodiments disclosed herein further incorporate one or more dopant implant processes 350 and 352 in order to selectively tune device drive current. For example, as shown in FIG. 1, a first implant region 114a can be formed within and at the first top surface 113a of the first channel region 116a of the first semiconductor fin 110a in the first MUGFET 101, one or more additional first implant regions 114b-c can be formed within and at the additional first top surfaces 113b-c of the additional first channel regions 116b-c of any additional first semiconductors fin 110b-c of the first MUGFET 101, and/or one or more second implant regions 124a-b can be formed within and at the second top surfaces 123a-b of the second channel regions 126a-b of the any second semiconductor fins 130a-b of any second MUGFET 102.

Figure 6:
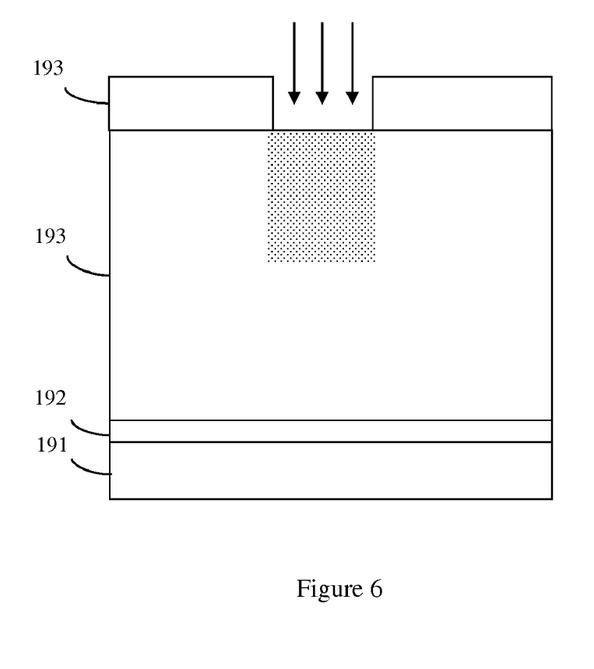
FIG. 6 is a schematic diagram illustrating an exemplary technique for performing the method steps 350 and/or 352 of FIG. 3.
Figure 7:
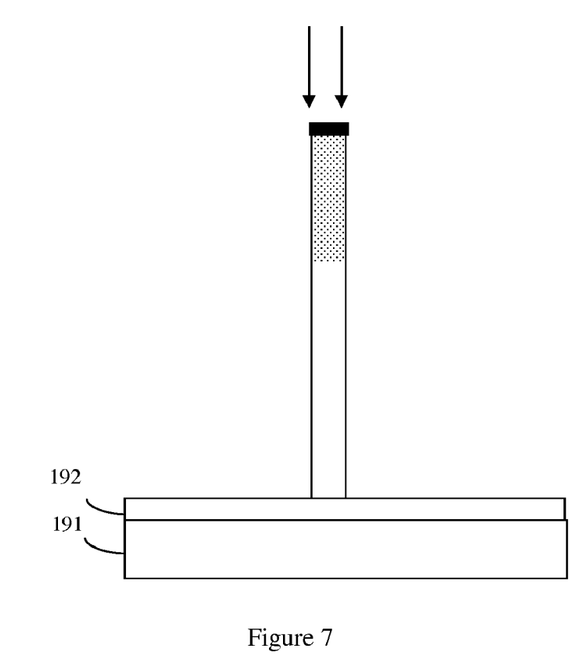
FIG. 7 is a schematic diagram illustrating another exemplary technique for performing the method steps 350 and/or 352 of FIG. 3.
Figure 8:
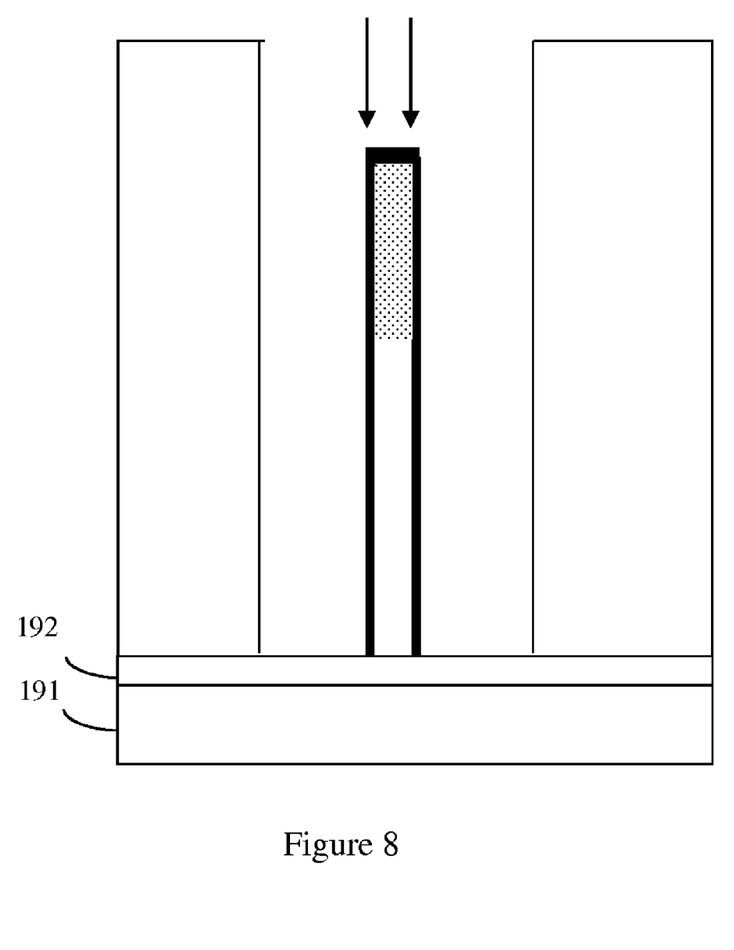
FIG. 8 is a schematic diagram illustrating another exemplary technique for performing the method steps 350 and/or 352 of FIG. 3.

The dopant implant processes 350 and 352 can be performed at any of multiple different points during MUGFET processing. For example, as illustrated in FIG. 6, the dopant implant processes 350 and/or 352 can be performed before any semiconductor fins are formed at process 304. Alternatively, as illustrated in FIG. 7, the dopant implant processes 350 and/or 352 can be performed after any semiconductor fins are formed at process 304, but prior to gate formation at process 312. Alternatively, the dopant implant processes 350 and/or 352 can be performed after the semiconductor fins are formed at process 304 and further after replacement gates have been formed and subsequently removed at process 316-320, but prior to final gate formation at process 322. As discussed above with respect to the structure embodiments, these implant regions 114a-c, 124a-b within channel regions 116a-c, 126a-b in the resulting MUGFETs 101, 102 are used to selectively adjust the effective channel width of the semiconductor fins (e.g., 110a-c and 120a-b, respectively) and, thereby to selectively tune device 101, 102 drive current.

Specifically, the method embodiments can comprise performing a first dopant implant process 350 so as to form, a first implant region 114a, comprising a first dopant, within the first channel region 116a at the first top surface 113a of a first semiconductor fin 110a in the resulting first MUGFET 101 (350). This first dopant can be pre-selected based on conductivity type so that it causes the threshold voltage of the first upper portion 112a of the first channel region 116a of that first semiconductor fin 110a to be selectively different (i.e., higher or lower) than the threshold voltage of the first lower portion 111a of the first channel region 116a. For example, in one embodiment of the method, the first dopant can be pre-selected at process 350 such that it has a second conductivity type (e.g., p-type) that is different from the first conductivity type (e.g., n-type) of the first MUGFET 101. That is, if the first MUGFET 101 comprises a n-FET, the first dopant can comprise a p-type dopant. Thus, the first dopant in the first implant region 114a will cause the threshold voltage of the first upper portion 112a of the first channel region 116a in the first semiconductor fin 110a of the first MUGFET 101 to be greater than the threshold voltage of the first lower portion 111a of the first channel region 116a.

In this method embodiment, the first dopant implant process 350 can also, optionally, simultaneously form an additional first implant region 114b, comprising the first dopant, within and at the additional first top surface 113b of the additional first channel region 116b of at least one additional first semiconductor fin 110b of the first MUGFET 101. In this case, since the additional first semiconductor fin 110b is to be incorporated into the first conductivity type MUGFET 101, the first dopant with the second conductivity type within the additional first implant region 114b will cause the threshold voltage of the additional first upper portion 112b of the additional first channel region 116b of that additional first semiconductor fin 110b to be greater than the threshold voltage of the additional first lower portion 111b of that additional first channel region 116b.

In this method embodiment, the first dopant implant process 350 can also, optionally, simultaneously form a second implant region 124a, comprising the first dopant, in a second channel region 126a at the second top surface 123a of at least one second semiconductor fin 120a of the second MUGFET 102. In this case, since the second semiconductor fin 120a is to be incorporated into the second conductivity type MUGFET 102, the first dopant with the second conductivity type within second implant region 124a will cause the threshold voltage of the second upper portion 122a of the second channel region 126a of the second semiconductor fin 120a to be less than the threshold voltage of the second lower portion 121a of that second channel region 126a.

Alternatively or additionally, in this method embodiment, a second implant process 352 can be performed. This second dopant process 352 can be used, for example, to form an additional first implant region 114c, comprising a second dopant, within and at the additional first top surface 113c of the additional first channel region 116c of at least one additional first semiconductor fin 110c of the first MUGFET 101. The second dopant can be pre-selected so that it has a different conductivity type than the first dopant used in the first dopant process 350 (i.e., such that it has a first conductivity type). In this case, since the additional first semiconductor fin 110c is to be incorporated into the first conductivity type MUGFET 101, the second dopant with the first conductivity type within the additional first implant region 114c will cause the threshold voltage of the additional first upper portion 112c of the additional first channel region 116c of the additional first semiconductor fin 110c to be less than the threshold voltage of the additional first lower portion 111c of that additional first channel region 116c.

In this method embodiment, the second dopant implant process 352 can also, optionally, simultaneously form a second implant region 124b, comprising the second dopant, in the second channel region 126b at the second top surface 123b of at least one second semiconductor fin 120b of the second MUGFET 102. In this case, since the second semiconductor fin 120b is to be incorporated into the second conductivity type MUGFET 102, the second dopant with the first conductivity type within the second implant region 124b will cause the threshold voltage of the second upper portion 122b of the second channel region 126b of the second semiconductor fin 120b to be greater than the threshold voltage of the second lower portion 121b of the second channel region 126b.

In an alternative method embodiment, the first dopant can be pre-selected at process 350 such that it has the same first conductivity type as the MUGFET 101, rather than the second conductivity type. That is, if the first MUGFET 101 comprises a n-FET, the first dopant can comprise a n-type dopant. Thus, the first dopant within the first implant region 114a of the first channel region 116a of the first semiconductor fin 110a will cause the threshold voltage of the first upper portion 112a of the first channel region 116a to be less than the threshold voltage of the first lower portion 111a of that first channel region 116a.

In this alternative method embodiment, the first dopant implant process 350 can also, optionally, simultaneously form an additional first implant region 114b, comprising the first dopant, within and at the additional first top surface 113b of the additional first channel region 116b of at least one additional first semiconductor fin 110b. In this case, since the additional first semiconductor fin 110b is to be incorporated into the first conductivity type MUGFET 101, the first dopant with the first conductivity type within the additional first implant region 114b a will cause the threshold voltage of the additional first upper portion 112b of the additional first channel region 116b to be less than the threshold voltage of the additional first lower portion 111b of that additional first channel region 116b.

In this alternative embodiment, the first dopant implant process 350 can also, optionally, simultaneously form a second implant region 124a, comprising the first dopant, in the second channel region 126a at the second top surface 123a of at least one second semiconductor fin 120a of the second MUGFET 102. In this case, since the second semiconductor fin 120a is to be incorporated into the second conductivity type MUGFET 102, the first dopant with the first conductivity type in the second implant region 124a will cause the threshold voltage of the second upper portion 122a of the second channel region 126a of the second semiconductor fin 120a to be greater than the threshold voltage of the second lower portion 121a of that second channel region 126a.

Alternatively or additionally, in this alternative embodiment, a second dopant implant process 352 can be performed. This second dopant process 352 can be used, for example, to form an additional first implant region 114c, comprising a second dopant, within and at the additional first top surface 113c of the additional first channel region 116c of at least one additional first semiconductor fin 110c of the first MUGFET 101. In this alternative embodiment, the second dopant can be pre-selected so that it has a different conductivity type than the first dopant used in the first dopant process 350 (i.e., such that it has a second conductivity type). In this case, since the additional first semiconductor fin 110c is to be incorporated into the first conductivity type MUGFET 101, the second dopant with the second conductivity type within additional first implant region 114c will cause the threshold voltage of the additional first upper portion 112c of the additional first channel region 116c of the additional first semiconductor fin 110c to be greater than the threshold voltage of the additional first lower portion 121c of that additional first channel region 126c.

In this alternative embodiment, the second dopant implant process 352 can also, optionally, simultaneously form a second implant region 124b, comprising the second dopant, in the second channel region 126b at the second top surface 123b of at least one second semiconductor fin 120b of the second MUGFET 102. In this case, since the second semiconductor fin 120b is to be incorporated into the second conductivity type MUGFET 102, the second dopant with the second conductivity type in the second implant region 124b will cause the threshold voltage of the second upper portion 122b of the second channel region 126b of the second semiconductor fin 120b to be greater than the threshold voltage of the second lower portion 121b of that second channel region 126b.

In the above-described method embodiments, the conductivity type (i.e., n-type or p-type) of the dopants used during the dopant implant processes 350, 352 can be varied from fin to fin within a multi-fin MUGFET or between different single and/or multi-fin MUGFETs so that individual device drive current can be optimized. Furthermore, the sizes of the resulting implant regions 114a-c, 124a-b or even the use of implant regions can be varied from fin to fin within a multi-fin MUGFET or between different single and/or multi-fin MUGFETs so that individual device drive current can be optimized. For example, as illustrated in FIG. 1, the first semiconductor fin 110d is configured without an implant region. The depth 117a of the first implant region 114a in the first semiconductor fin 110a is approximately equal to the depth 117b of the additional first implant region 114b in the additional first semiconductor fin 110b, but different than (e.g., greater than) the depth 117c of the additional first implant region 114c in the additional first semiconductor fin 110c.

Those skilled in the art will recognize that a first semiconductor fin (e.g., 110d) without an implant region can be achieved by masking during that dopant implant processes 350 and 352. Those skilled in the art will also recognize that semiconductor fins with different sized implant regions having the same dopant can be achieved by performing a multi-step dopant implant process. For example, in a first step of the multi-step dopant implant process a dopant can be implanted to a first shallow depth in two different fins. Then, one of the fins could be masked and in a second step of the multi-step dopant implant process the dopant can be implanted to a second deeper depth in the unmasked fin.

The resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above, are embodiments of a semiconductor structure that comprises one or more MUGFETs, with each MUGFET comprising one or more semiconductor fins. In the embodiments, a dopant implant region is incorporated into the channel region of a semiconductor fin in order to selectively modify (i.e., decrease or increase) the threshold voltage of the upper portion of the channel region relative to the threshold voltage of the lower portion and, thereby to selectively adjust (i.e., decrease or increase, respectively) device drive current. In the case of multiple semiconductor fins, the use of implant regions, the dopant conductivity type in the implant regions and/or the sizes of the implant regions can be varied from fin to fin within a MUGFET or between different MUGFETs so that individual device drive current can be optimized. Also disclosed herein are embodiments of a method of forming the semiconductor structure. The embodiments provide a low cost and easily controllable method of solving quantization problems and adjusting device drive current. It should be noted that the resulting structure will exhibit additional capacitance and this additional capacitance must be weighted against the desire for drive current control. For example, while additional capacitance may be a disadvantage with high frequency circuits, its impact is minimal on low power and lower frequency circuits and is an advantage in some circuits (e.g., static random access memory (SRAM) arrays).

What is claimed is:

1. A semiconductor structure comprising:
   a substrate; and
   a first field effect transistor, having a first conductivity type, on said substrate, said first field effect transistor comprising:
   a first semiconductor fin comprising:
   a first channel region having a first top surface, a first lower portion and a first upper portion between said first top surface and said first lower portion, said first lower portion having a second conductivity type different from said first conductivity type; and
   a first implant region within said first upper portion channel region at said first top surface, said first implant region comprising a first dopant, having said first conductivity type, such that a threshold voltage of said first upper portion of said first channel region is less than a threshold voltage of said first lower portion of said first channel region.

2. The semiconductor structure of claim 1, said first field effect transistor further comprising:
   an additional first semiconductor fin comprising:
   an additional first channel region having an additional first top surface; and
   an additional first implant region within said additional first channel region at said additional first top surface, said additional first implant region comprising one of the following:
   said first dopant such that a threshold voltage of an additional first upper portion of said additional first channel region is less than a threshold voltage of an additional first lower portion of said additional first channel region; and
   a second dopant having said second conductivity type such that said threshold voltage of said additional first upper portion is greater than said threshold voltage of said additional first lower portion.

3. The semiconductor structure of claim 2, said first semiconductor fin and said additional first semiconductor fin being approximately equal in size and said first implant region and said additional first implant region being approximately equal in size.

4. The semiconductor structure of claim 2, said first semiconductor fin and said additional first semiconductor fin being approximately equal in size and said first implant region and said additional first implant region being different in size.

5. The semiconductor structure of claim 1, further comprising:
   a second field effect transistor, having said second conductivity type different from said first conductivity type, on said substrate, said second field effect transistor comprising:
   a second semiconductor fin comprising:
   a second channel region having a second top surface; and
   a second implant region within said second channel region at said second top surface, said second implant region comprising one of the following:
   said first dopant such that a threshold voltage of a second upper portion of said second channel region is greater than a threshold voltage of a second lower portion of said second channel region; and
   a second dopant having said second conductivity type such that said threshold voltage of said second upper portion is less than said threshold voltage of said second lower portion.

6. The semiconductor structure of claim 1, said first semiconductor fin comprising first source/drain regions above and immediately adjacent to said substrate, said first channel region being positioned laterally between said first source/drain regions.

7. The semiconductor structure of claim 6, said first source/drain regions and said first dopant in said first implant region having said first conductivity type.

8. A semiconductor structure comprising:
   a substrate; and
   a first field effect transistor, having a first conductivity type, on said substrate, said first field effect transistor comprising:
   a first semiconductor fin comprising:
   a first channel region having a first top surface; and a first implant region within said first channel region at said top surface, said first implant region comprising a first dopant, said first dopant causing a threshold voltage of a first upper portion of said first channel region to be different than a threshold voltage of a first lower portion of said channel region, and said first dopant having a second conductivity type different from said first conductivity type such that said threshold voltage of said first upper portion is greater than said threshold voltage of said first lower portion, and an additional first semiconductor fin comprising:
an additional first channel region having an additional first top surface; and
an additional first implant region within said additional first channel region at said additional first top surface, said additional first implant region comprising one of the following:
said first dopant such that a threshold voltage of an additional first upper portion of said additional first channel region is greater than a threshold voltage of an additional first lower portion of said additional first channel region; and
a second dopant having said first conductivity type such that said threshold voltage of said additional first upper portion is less than said threshold voltage of said additional first lower portion.

9. The semiconductor structure of claim 8, said first semiconductor fin and said additional first semiconductor fin being approximately equal in size and said first implant region and said additional first implant region being approximately equal in size.

10. The semiconductor structure of claim 8, said first semiconductor fin and said additional first semiconductor fin being approximately equal in size and said first implant region and said additional first implant region being different in size.

11. The semiconductor structure of claim 8, further comprising:
a second field effect transistor, having said second conductivity type, on said substrate, said second field effect transistor comprising:
a second semiconductor fin comprising:
a second channel region having a second top surface; and
a second implant region within said second channel region at said second top surface, said second implant region comprising one of the following:
said first dopant such that a threshold voltage of a second upper portion of said second channel region is less than a threshold voltage of a second lower portion of said second channel region; and
a second dopant having said first conductivity type such that said threshold voltage of said second upper portion is greater than said threshold voltage of said second lower portion.

12. A semiconductor structure comprising:
a substrate; and
a first field effect transistor, having a first conductivity type, on said substrate, said first field effect transistor comprising:

a first semiconductor fin comprising:
a first channel region having a first top surface, a first lower portion and a first upper portion between said first to surface and said first lower portion, said first lower portion having a second conductivity type different from said first conductivity type; and
a first implant region within said first upper portion channel region at said first top surface, said first implant region comprising a first dopant, having said first conductivity type; and
first source/drain regions, having said first conductivity type, above and immediately adjacent to said substrate, said first channel region being positioned laterally between said first source/drain regions.

13. The semiconductor structure of claim 12, said first field effect transistor further comprising:
an additional first semiconductor fin comprising:
an additional first channel region having an additional first top surface; and
an additional first implant region within said additional first channel region at said additional first top surface, said additional first implant region comprising one of the following:
said first dopant such that a threshold voltage of an additional first upper portion of said additional first channel region is less than a threshold voltage of an additional first lower portion of said additional first channel region; and
a second dopant having said second conductivity type such that said threshold voltage of said additional first upper portion is greater than said threshold voltage of said additional first lower portion.

14. The semiconductor structure of claim 13, said first semiconductor fin and said additional first semiconductor fin being approximately equal in size and said first implant region and said additional first implant region being approximately equal in size.

15. The semiconductor structure of claim 13, said first semiconductor fin and said additional first semiconductor fin being approximately equal in size and said first implant region and said additional first implant region being different in size.

16. The semiconductor structure of claim 12, further comprising:
a second field effect transistor, having a second conductivity type different from said first conductivity type, on said substrate, said second field effect transistor comprising:
a second semiconductor fin comprising:
a second channel region having a second top surface; and
a second implant region within said second channel region at said second top surface, said second implant region comprising one of the following:
said first dopant such that a threshold voltage of a second upper portion of said second channel region is greater than a threshold voltage of a second lower portion of said second channel region; and
a second dopant having said second conductivity type such that said threshold voltage of said second upper portion is less than said threshold voltage of said second lower portion.

* * * * *